United States Patent
Imamura et al.

(10) Patent No.: US 9,444,662 B2
(45) Date of Patent: Sep. 13, 2016

(54) CONTENTION AVOIDANCE CONTROL DEVICE AND CONTENTION AVOIDANCE CONTROL METHOD FOR PWM OUTPUT AND A/D CONVERSION, AS WELL AS POWER CONTROL SYSTEM

(71) Applicant: Panasonic Intellectual Property Management Co., Ltd., Osaka (JP)

(72) Inventors: Katsuyuki Imamura, Osaka (JP); Tetsuro Sugioka, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/802,963

(22) Filed: Jul. 17, 2015

(65) Prior Publication Data

US 2015/0326415 A1   Nov. 12, 2015

Related U.S. Application Data

(63) Continuation of application No. PCT/JP2013/006911, filed on Nov. 25, 2013.

(30) Foreign Application Priority Data

Jan. 18, 2013   (JP) ................. 2013-007790

(51) Int. Cl.
*H03K 7/08* (2006.01)
*H04L 25/49* (2006.01)
*H03M 1/08* (2006.01)

(52) U.S. Cl.
CPC ............ *H04L 25/4902* (2013.01); *H03M 1/08* (2013.01)

(58) Field of Classification Search
CPC ...... H04K 7/08; H04L 25/4902; H03F 3/217
USPC ............................ 375/238, 242, 252; 702/64
See application file for complete search history.

(56) References Cited

U.S. PATENT DOCUMENTS

| | | | |
|---|---|---|---|
| 2008/0125988 A1 | 5/2008 | Watanabe et al. | |
| 2011/0182096 A1* | 7/2011 | Suzuki | G06F 1/025 363/131 |
| 2013/0193936 A1* | 8/2013 | Henzler | H02M 3/158 323/271 |

FOREIGN PATENT DOCUMENTS

| | | |
|---|---|---|
| JP | 2008-58035 A | 3/2008 |
| JP | 2008-153839 A | 7/2008 |

OTHER PUBLICATIONS

International Search Report dated Feb. 4, 2014 issued in International Patent Application No. PCT/JP2013/006911 (Partial English translation thereof).

* cited by examiner

*Primary Examiner* — Khai Tran
(74) *Attorney, Agent, or Firm* — McDermott Will & Emery LLP

(57) ABSTRACT

In a contention avoidance control device and a contention avoidance control method for PWM output and A/D conversion, the change timings of PWM outputs are detected, and output of a received A/D conversion trigger to an A/D conversion circuit is inhibited within a predetermined time measured based on the change timings.

23 Claims, 14 Drawing Sheets

CONTENTION AVOIDANCE CONTROL DEVICE AND CONTENTION AVOIDANCE CONTROL METHOD FOR PWM OUTPUT AND A/D CONVERSION, AS WELL AS POWER CONTROL SYSTEM

CROSS-REFERENCE TO RELATED APPLICATION

This is a continuation of PCT International Application PCT/JP2013/006911 filed on Nov. 25, 2013, which claims priority to Japanese Patent Application No. 2013-007790 filed on Jan. 18, 2013. The disclosures of these applications including the specifications, the drawings, and the claims are hereby incorporated by reference in their entirety.

BACKGROUND

The present disclosure relates to a control device and a control method for a pulse width modulation (PWM) circuit and an analog-to-digital (AD) converter circuit that are suitably used for a feedback control equipment system having a plurality of objects to be controlled.

Household electric consumer appliances such as air conditioners, refrigerators, and washing machines, uninterruptible power supplies (UPSs), power conditioners (power control devices), power supplies for PC servers, and power supplies for cell sites incorporate systems for performing feedback control (inverter control or converter control) using A/D converter circuits and PWM circuits for motor control and power supply control. In recent years, environmentally compatible low-power consumption design has been demanded, and microcomputer control using highly efficient algorithms has been employed together with inverter control and converter control. In addition, in many applications, a single microcomputer performs a plurality of types of control such as control of a plurality of motors and a combination of power supply control and motor control.

Under these circumstances, a technique of performing inverter control on a plurality of motors by incorporating A/D converters for individually detecting locations of the motors is proposed (see, for example, Japanese Unexamined Patent Publication No. 2008-153839).

SUMMARY

In controlling a power device for a motor based on a PWM output, switching noise of the power device occurs at the time when the PWM output changes (hereinafter referred to as a "change timing"). This switching noise is transmitted to an input of an A/D converter circuit. Thus, A/D conversion preferably avoids the change timing of the PWM output.

However, in the case of performing inverter control of a plurality of motors with parallel processing of A/D converter circuits for detecting the locations of the motors, switching noise of the power devices occurs at the change timings of PWM outputs with different periods.

It is easy for a configuration including a PWM output and an A/D converter circuit for one motor to prevent the change timing of a PWM output having a certain period from contending with the timing of starting conversion of the A/D converter circuit. On the other hand, the periods of the change timings of PWM outputs with different periods are not uniform, and thus, it is difficult for the PWM outputs to avoid contention with the timing of starting conversion of the A/D converter circuit.

The same holds for a case where one A/D converter circuit is provided for a plurality of motors.

It is therefore an object of the present disclosure to ease A/D conversion while avoiding the timing of transmitting switching noise of a power device even in the case of performing inverter control on a plurality of motors.

To achieve the object, in a contention avoidance control device and a contention avoidance control method for PWM output and A/D conversion according to an aspect of the present disclosure, a change timing of a PWM output is detected, and an output of a received AD conversion trigger to an A/D converter is inhibited during a predetermined time measured based on the change timing.

In the contention avoidance control device and the contention avoidance control method for PWM output and A/D conversion, after a lapse of the predetermined time, an A/D conversion trigger input received in the predetermined time may be output as an A/D conversion trigger output to the A/D converter.

In the contention avoidance control device and the contention avoidance control method for PWM output and A/D conversion, the predetermined time may be arbitrarily set.

In the contention avoidance control device and the contention avoidance control method for PWM output and A/D conversion, the PWM output may include a plurality of PWM outputs such that the contention avoidance control device detects change timings of the plurality of PWM outputs and inhibits an output of a received A/D conversion trigger to the A/D converter circuit during a predetermined time measured based on the change timings.

In the contention avoidance control device and the contention avoidance control method for PWM output and A/D conversion, time may be measured for each of the plurality of PWM outputs.

In the contention avoidance control device and the contention avoidance control method for PWM output and A/D conversion, the change timing may be detected by detecting at least one of a rising edge or a falling edge of the PWM output.

In the contention avoidance control device and the contention avoidance control method for PWM output and A/D conversion, the A/D conversion trigger input may be output as the A/D conversion trigger output in a case where the A/D conversion trigger input is not output after a lapse of a second arbitrary time from reception of the A/D conversion trigger input.

In the contention avoidance control device for PWM output and A/D conversion, the A/D conversion trigger input may be invalidated in a case where the A/D conversion trigger input is not output after a lapse of a second arbitrary time from reception of the A/D conversion trigger input.

In the contention avoidance control method for PWM output and A/D conversion, the A/D conversion trigger input may be invalidated when a second arbitrary time has elapsed from reception of the A/D conversion trigger input.

In the contention avoidance control method for PWM output and A/D conversion, the A/D conversion trigger input may be invalidated in a case where a change of the A/D conversion trigger input is counted up to a predetermined number of times before the second arbitrary time elapses.

In the contention avoidance control device and the contention avoidance control method for PWM output and A/D conversion, the A/D conversion trigger input may be output as the A/D conversion trigger output in a case where the A/D conversion trigger input is not output when the A/D conversion trigger input is counted up to a predetermined number of times within the predetermined time.

In the contention avoidance control device for PWM output and A/D conversion, the A/D conversion trigger input may be invalidated in a case where the A/D conversion trigger input is not output when the A/D conversion trigger input is counted up to a predetermined number of times within the predetermined time.

In the contention avoidance control device for PWM output and A/D conversion, the A/D conversion trigger input may be output as an A/D conversion sample-and-hold control signal to the A/D converter circuit, and the A/D conversion sample-and-hold control signal may be used to extend a sample-and-hold time of the A/D converter circuit for the predetermined time.

In a contention avoidance control device and a contention avoidance control method for PWM output and A/D conversion according to another aspect of the present disclosure, change timings of a plurality of PWM outputs are detected, and an A/D conversion trigger input received in a predetermined time measured based on the change timings is invalidated.

In a contention avoidance control method for PWM output and A/D conversion according to yet another aspect of the present disclosure includes: detecting change timings of a plurality of PWM outputs; and delaying an A/D conversion trigger input received in a predetermined time measured based on the change timings and outputting the delayed A/D conversion trigger input as an A/D conversion sample-and-hold control signal to an A/D converter circuit, wherein the A/D conversion sample-and-hold control signal is used to extend a sample-and-hold time of the A/D converter circuit for the predetermined time.

A power control system according to still another aspect of the present disclosure includes: a plurality of converter devices; and a microcomputer that includes one of the contention avoidance control devices described above and controls the plurality of converter devices, wherein the microcomputer controls the plurality of converter devices so as to avoid contention between PWM outputs for controlling the plurality of converter devices and A/D conversion.

According to the present disclosure, even in inverter control of a plurality of motors, A/D conversion can be performed at timings except the timings when a plurality of PWM outputs change. Thus, noise due to the changes of the PWM outputs, which might cause deterioration of conversion accuracy of an A/D converter circuit, can be reduced, and furthermore, the influence of transmission of switching noise of power devices for the motors can be easily reduced.

DETAILED DESCRIPTION

Figure 1:
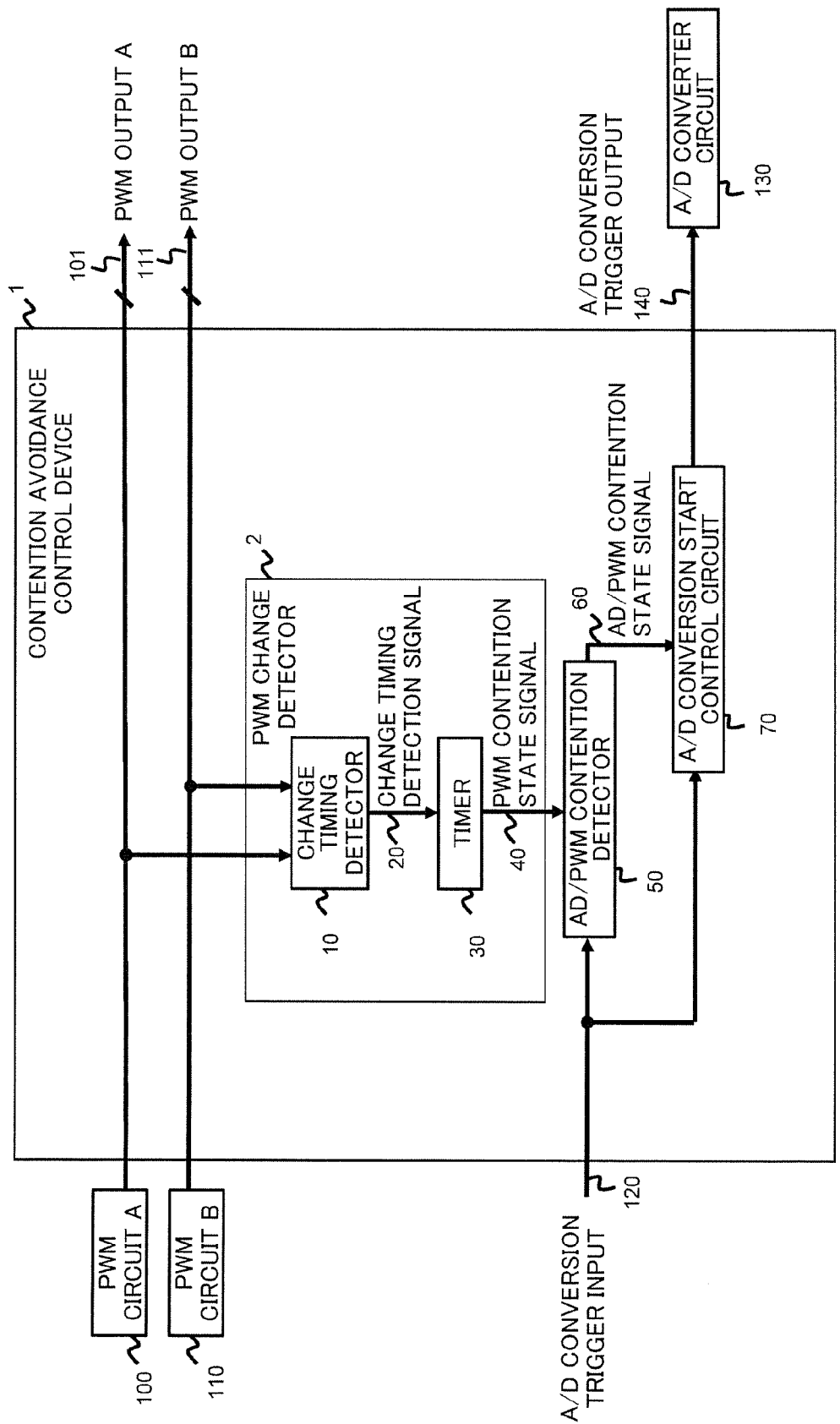
FIG. 1 illustrates a contention avoidance control device according to a first embodiment.

Embodiments of the present disclosure will be described with reference to FIGS. 1 to 14. However, description of the same or similar elements will not be repeated in principle unless explicitly required. Signals and other elements may be referred to only as their reference characters after the first appearance.

First Embodiment

FIG. 1 illustrates an example configuration of a contention avoidance control device according to a first embodiment of the present disclosure. A contention avoidance control device 1 receives a PWM output A 101 of a PWM circuit A100, a PWM output B 111 of a PWM circuit B 110, and an A/D conversion trigger input 120, and outputs an A/D conversion trigger output 140 to an A/D converter circuit 130.

Each of the PWM output A 101 and the PWM output B 111 may be one signal (one phase) or a bundle of signals (e.g., a bundle of three signals (three phases)). A change in the number of PWM outputs corresponding to one PWM circuit is merely a design change, and thus, the PWM output is represented as a single line in the following description and drawings, for simplicity.

The contention avoidance control device 1 includes a PWM change detector 2, an AD/PWM contention detector 50, and an A/D conversion start control circuit 70. The PWM change detector 2 receives the change timings of the PWM output A 101 and the PWM output B 111 and outputs a PWM contention state signal 40 indicating a state (hereinafter referred to as a PWM contention state) in a predetermined time based on the change timing of one of the PWM output A 101 or the PWM output B 111. The AD/PWM contention detector 50 outputs an AD/PWM contention state signal 60 indicating a contention state between A/D conversion and PWM (hereinafter referred to as an AD/PWM contention state) when receiving the A/D conversion trigger input 120 while the PWM contention state signal 40 shows the PWM contention state. When the AD/PWM contention state signal 60 shows the AD/PWM contention state, the A/D conversion start control circuit 70 outputs, as the A/D conversion trigger output 140, a signal delayed for a predetermined time until the A/D conversion trigger input 120 becomes out of the AD/PWM contention state (hereinafter referred to as an AD/PWM non-contention state) or cancels (invalidates) the output of the A/D conversion trigger output 140 itself so that the A/D conversion does not start. On the other hand, when the AD/PWM contention state signal 60 shows a state except the AD/PWM contention state, the A/D conversion start control circuit 70 outputs the A/D conversion trigger input 120 as the A/D conversion trigger output 140 without any processing such as delay or cancel.

The PWM change detector 2 includes a change timing detector 10 that detects the change timing of one of the PWM output A 101 or the PWM output B 111 and a timer 30. The timer 30 receives a change timing detection signal 20 that is output when the change timing detector 10 detects a change of one of the PWM output A 101 or the PWM output B 111, and measures an arbitrary time from when the change timing detection signal 20 starts changing.

The change timing of one of the PWM output A 101 or the PWM output B 111 herein refers to the time when at least one of a rising edge (positive edge) or a falling edge (negative edge) of one of the PWM output A 101 or the PWM output B 111 (or an output of one of a plurality of PWM outputs). An arbitrary time measured by the timer 30 is determined as time in which the influence of noise on the A/D converter circuit 130 can be reduced in consideration of device characteristics of a motor driving transistor circuit controlled based on the PWM output A 101 or the PWM output B 111.

The timer 30 may be a dedicated counter circuit or a general-purpose counter circuit having a timer count function to be controlled by software.

FIG. 1 illustrates a configuration including one A/D converter circuit 130, one corresponding A/D conversion trigger input 120, and one A/D conversion trigger output 140 for simplicity. Alternatively, a plurality of A/D converter circuits, a plurality of corresponding A/D conversion trigger inputs, and a plurality of A/D conversion trigger outputs (a plurality of A/D converter circuit systems) may be provided. Each of the A/D converter circuit systems may be provided with functions corresponding to the AD/PWM contention detector 50 and the A/D conversion start control circuit 70.

Figure 2A:
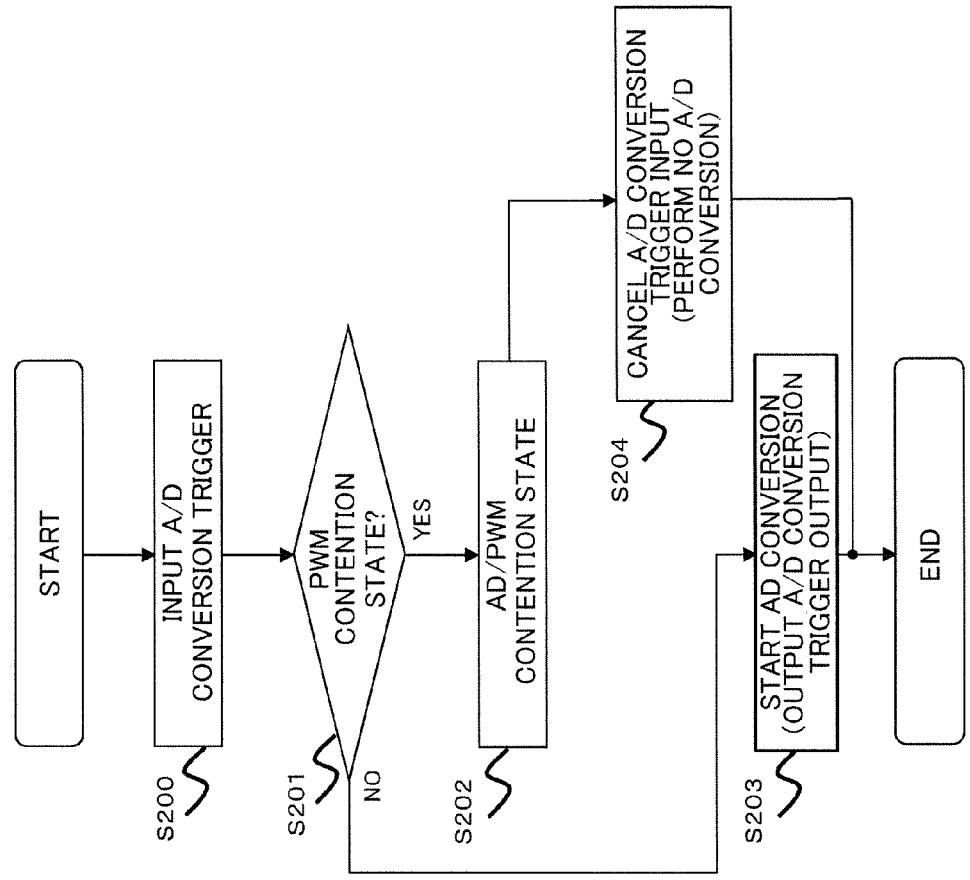
FIGS. 2A and 2B are flow charts showing operation of the contention avoidance control device of the first embodiment.

FIG. 2A is an example of a flow chart showing operation of the contention avoidance control device illustrated in FIG. 1. In the operation shown by this flow chart, a signal delayed for a predetermined time until the A/D conversion trigger input 120 becomes out of the AD/PWM contention state is output as the A/D conversion trigger output 140 in a case where the A/D conversion trigger input 120 is in the AD/PWM contention state when the A/D conversion trigger input 120 is received.

In step S200, the A/D conversion trigger input 120 is input to the contention avoidance control device 1.

In step S201, when the A/D conversion trigger input 120 is input or if the A/D conversion trigger input 120 is in the AD/PWM contention state at step S202, which will be described below, it is determined whether the output of the PWM contention state signal 40 shows the PWM contention state. It will be described below how it is determined whether the output of the PWM contention state signal 40 shows the PWM contention state or not.

In step S202, if YES in step S201 (i.e., if the A/D conversion trigger input 120 is in the PWM contention state), the output of the AD/PWM contention state signal 60 is set in the AD/PWM contention state, and the A/D conversion trigger input 120 is delayed for an arbitrary time.

In step S203, if NO in step S201 (i.e., if the A/D conversion trigger input 120 is not in the PWM contention state), the A/D conversion trigger output 140 is output, and A/D conversion starts.

Figure 2B:
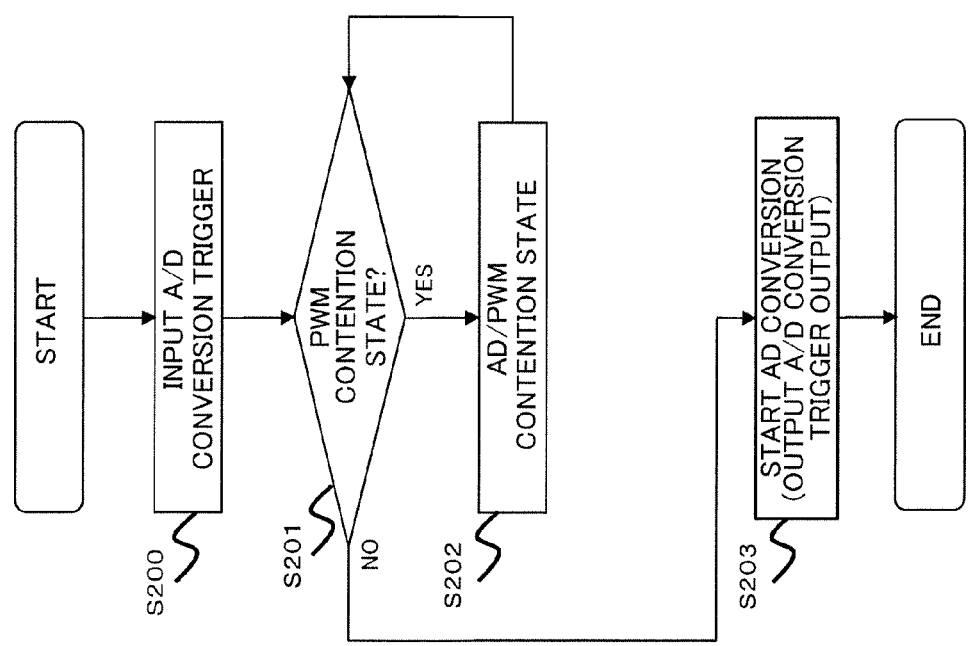

FIG. 2B is another example of the flow chart showing operation of the contention avoidance control device illustrated in FIG. 1. In the operation shown by this flow chart, the output of the A/D conversion trigger output 140 itself is canceled such that A/D conversion does not start in a case where the A/D conversion trigger input 120 is in the AD/PWM contention state when the A/D conversion trigger input 120 is received.

Steps designated by the same reference numbers as those in FIG. 2A represent the same steps as those in FIG. 2A, and only a step designated by different reference numbers from those in FIG. 2A will be described.

In step S204, if the A/D conversion trigger input 120 is in the AD/PWM contention state in step S202, the A/D conversion trigger input 120 is canceled, and no A/D conversion is performed, thereby finishing the operation.

Figure 3:
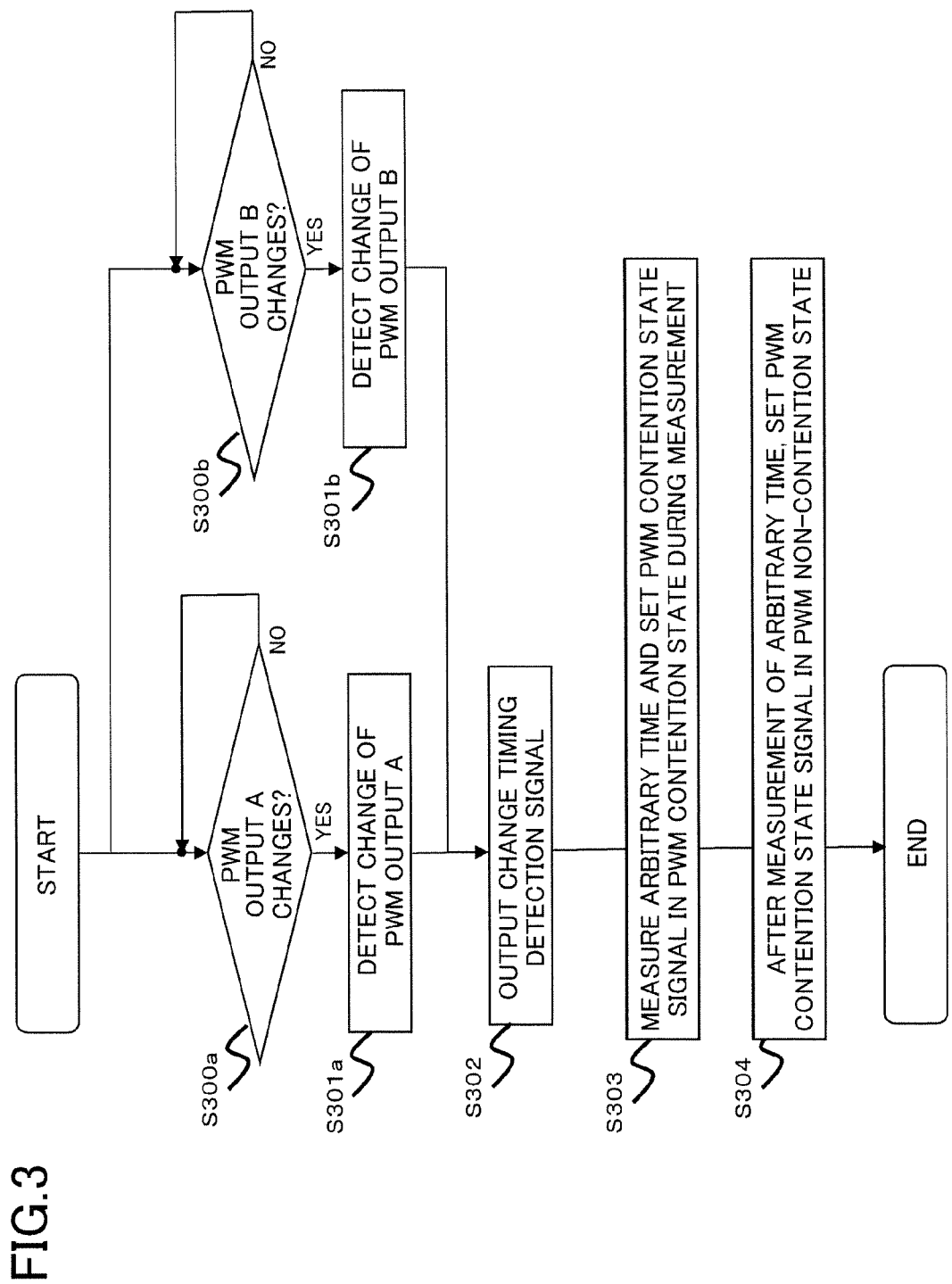
FIG. 3 is a flow chart showing an operation of a PWM change detector according to the first embodiment.

FIG. 3 shows an example of operation of the PWM change detector 2 illustrated in FIG. 1.

In step S300a, the change timing of the PWM output A 101 is detected. If a change of the PWM output A 101 is detected, the process proceeds to next step S301a. If the change is not detected, the detection continues until the change timing of the PWM output A 101 is detected.

In step S300b, the change timing of the PWM output B 111 is detected. If a change of the PWM output B 111 is detected, the process proceeds to next step S301b. If the change is not detected, the detection continues until the change timing of the PWM output B 111 is detected.

Step S301a is a state in which the change of the PWM output A 101 is detected.

Step S301b is a state in which the change of the PWM output B 111 is detected.

In step S302, if the change of one of the PWM output A 101 or the PWM output B 111 is detected in step S301a or step S301b, the change timing detection signal 20 is output.

In step S303, an arbitrary time that starts when the output of the change timing detection signal 20 changes at step S302 is measured, and the output of the PWM contention state signal 40 is set in the "PWM contention state" during the measurement.

In an example of output of the PWM contention state signal 40, a logic "1" corresponds to a "PWM contention state," and a logic "0" corresponds to a "PWM non-contention state."

In step S304, after the arbitrary time has been measured, the output of the PWM contention state signal 40 is set in the "PWM non-contention state."

Here, if a change of the PWM output B 111 is additionally detected in a state in which a change of the PWM output A 101 is detected and the PWM contention state signal 40 is being output, for example, the measurement of the arbitrary time starts again at the time when the change of the PWM output B 111 is additionally detected. On the other hand, if a change of the PWM output A 101 is additionally detected in a state in which a change of the PWM output B 111 is detected and the PWM contention state signal 40 is being output, for example, the measurement of the arbitrary time starts again at the time when the change of the PWM output A 101 is additionally detected.

The arbitrary time may be measured by hardware control such as control with a timer counter or by software control such as interrupt processing or loop handling.

Figure 4:
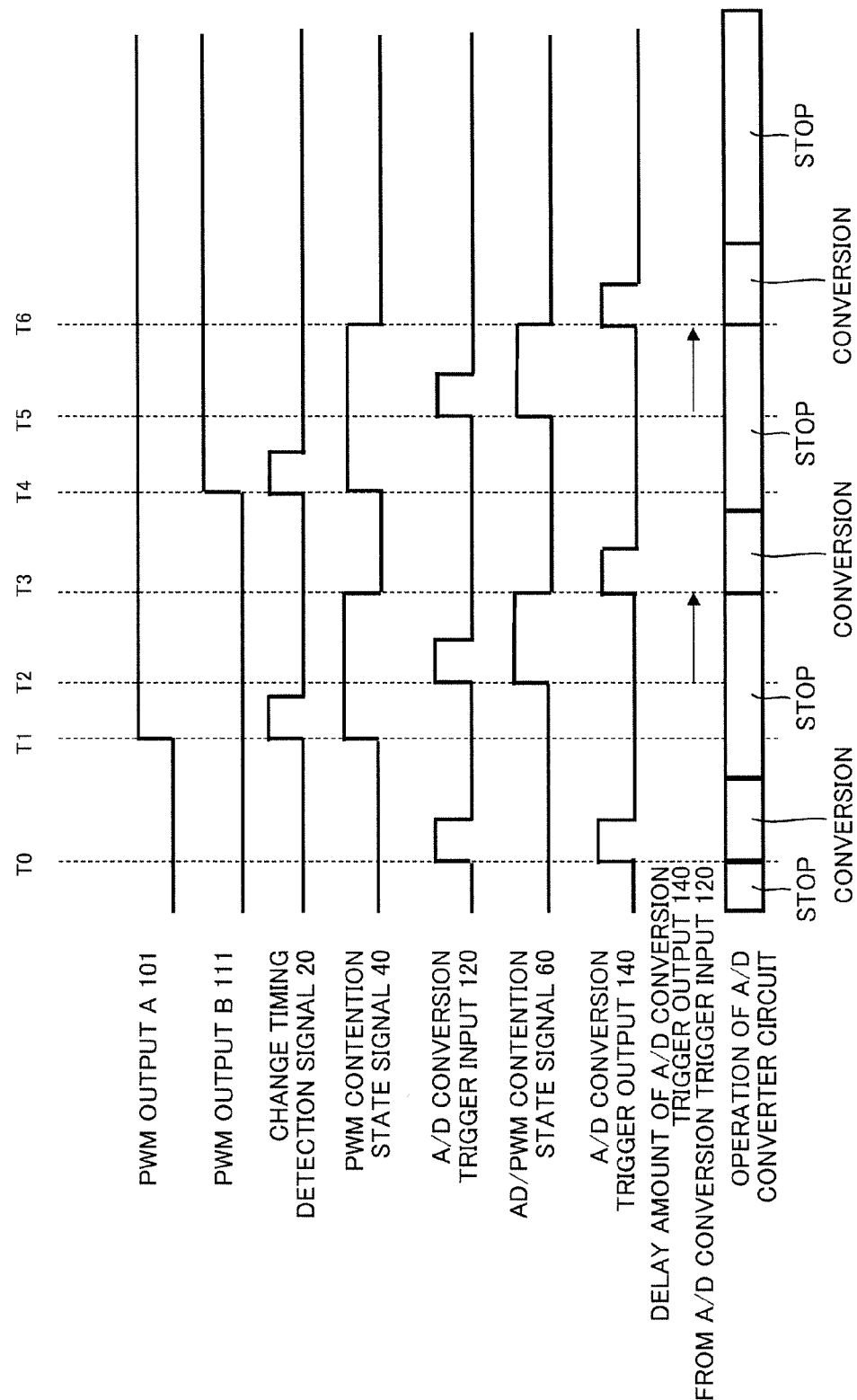
FIG. 4 is a timing chart showing an example of operation of the contention avoidance control device of the first embodiment.

FIG. 4 is a timing chart showing an example of operation of the contention avoidance control device illustrated in FIG. 1.

At time T0, the A/D conversion trigger input 120 is input, but each of the PWM output A 101 and the PWM output B 111 does not change (i.e., is in the PWM non-contention state). Thus, the A/D conversion trigger input 120 is output as the A/D conversion trigger output 140 without change, and the A/D converter circuit 130 performs A/D conversion.

At time T1, the PWM output A 101 changes so that the PWM change detector 2 generates a change timing detection signal 20 and measurement of an arbitrary time starts. In the measurement, the PWM contention state signal 40 is output as the "PWM contention state."

At time T2, the A/D conversion trigger input 120 is input, but the A/D conversion trigger output 140 does not change because the state is the "PWM contention state."

At time T3, the measurement of the arbitrary time is completed, and the PWM contention state signal 40 changes to the "PWM non-contention state." At this time, the A/D conversion trigger output 140 is output, and the A/D converter circuit 130 performs A/D conversion.

At time T4, the PWM output B 111 changes so that the PWM change detector 2 generates the change timing detection signal 20 and measurement of an arbitrary time starts. In the measurement, the PWM contention state signal 40 is output as the "PWM contention state."

At time T5, the A/D conversion trigger input 120 is input, but the A/D conversion trigger output 140 does not change because the state is the "PWM contention state."

At time T6, the measurement of the arbitrary time is completed, and the PWM contention state signal 40 changes to the "PWM non-contention state." At this time, the A/D conversion trigger output 140 is output, and the A/D converter circuit 130 performs A/D conversion.

Figure 5:
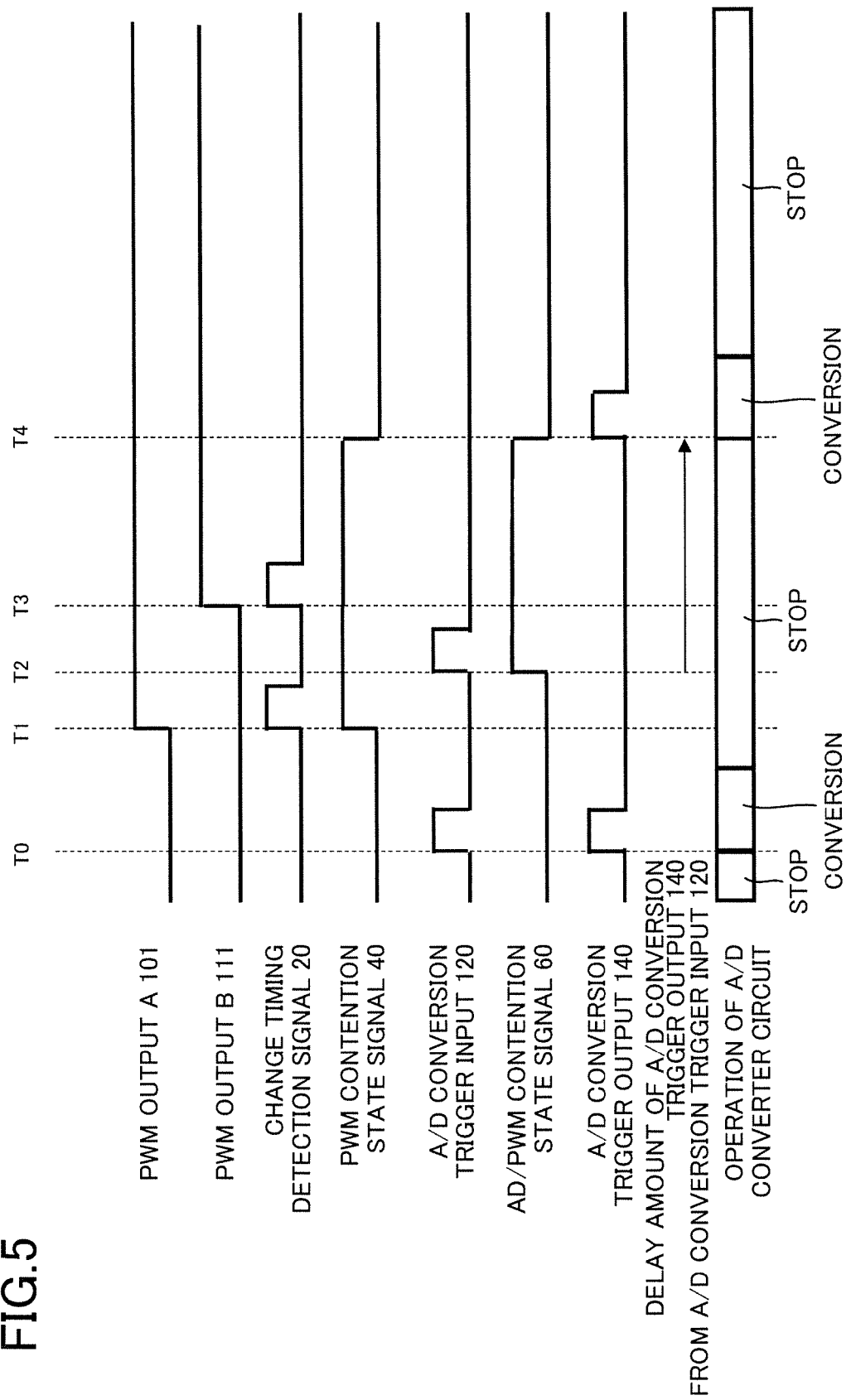
FIG. 5 is a timing chart showing another example of operation of the contention avoidance control device of the first embodiment.

FIG. 5 is a timing chart showing another example of operation of the contention avoidance control device illustrated in FIG. 1.

At time T0, the A/D conversion trigger input 120 is input, but each of PWM output A 101 and the PWM output B 111 does not change (i.e., is in the PWM non-contention state). Thus, the A/D conversion trigger input 120 is output as the A/D conversion trigger output 140 without change, and the A/D converter circuit 130 performs A/D conversion.

At time T1, the PWM output A 101 changes so that the PWM change detector 2 generates the change timing detection signal 20 and measurement of an arbitrary time starts. In the measurement, the PWM contention state signal 40 is output as the "PWM contention state."

At time T2, the A/D conversion trigger input 120 is input, but the A/D conversion trigger output 140 does not change because the state is the "PWM contention state."

At time T3, the PWM output B 111 changes before the measurement of the arbitrary time that has started at time T1 is completed. The PWM change detector 2 generates the change timing detection signal 20, and measurement of another arbitrary time starts at time T3. During the measurement, the PWM contention state signal 40 is output as the "PWM contention state." Thus, the "PWM contention state" that has started at time T1 continues without change.

At time T4, the measurement of the arbitrary time that has started at time T3 is completed, and the PWM contention state signal 40 changes to the "PWM non-contention state." At this time, the A/D conversion trigger output 140 is output, and the A/D converter circuit 130 performs A/D conversion.

Figure 6:
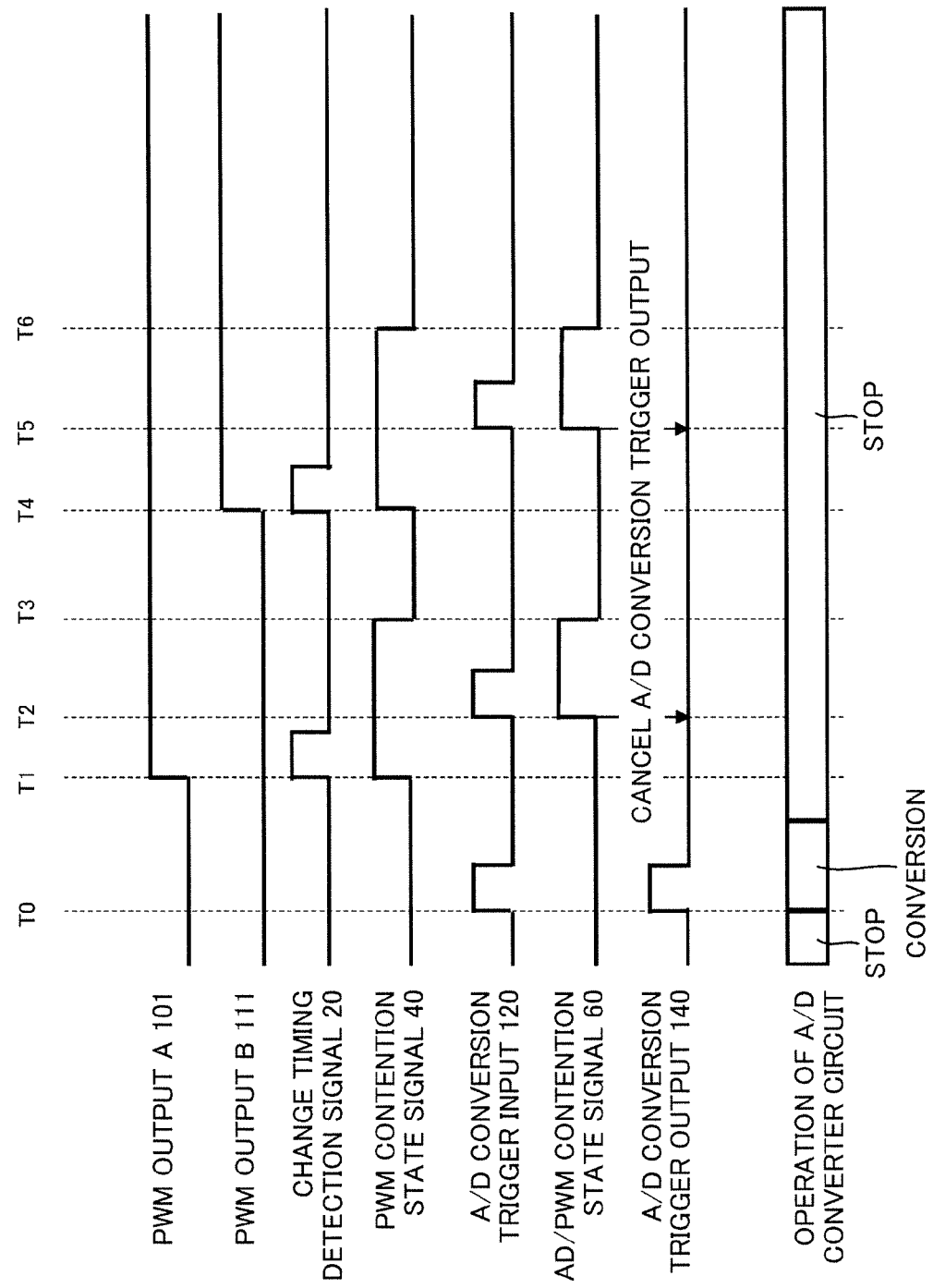
FIG. 6 is a timing chart showing still another example of operation of the contention avoidance control device of the first embodiment.

FIG. 6 is a timing chart showing still another example of operation of the contention avoidance control device illustrated in FIG. 1.

At time T0, the A/D conversion trigger input 120 is input, but each of the PWM output A 101 and the PWM output B 111 does not change (i.e., is in the PWM non-contention state). Thus, the A/D conversion trigger input 120 is output as the A/D conversion trigger output 140 without change, and the A/D converter circuit 130 performs A/D conversion.

At time T1, the PWM output A 101 changes so that the PWM change detector 2 generates the change timing detection signal 20 and measurement of an arbitrary time starts. During the measurement, the PWM contention state signal 40 is output as the "PWM contention state."

At time T2, the A/D conversion trigger input 120 is input, but since the state is the "PWM contention state," the AD/PWM contention state signal 60 is in the AD/PWM contention state. Accordingly, the output of the A/D conversion trigger output 140 itself is canceled.

At time T3, the measurement of the arbitrary time is completed, and the PWM contention state signal 40 changes to the "PWM non-contention state."

At time T4, the PWM output B 111 changes so that the PWM change detector 2 generates the change timing detection signal 20, and measurement of an arbitrary time starts. During the measurement, the PWM contention state signal 40 is output as the "PWM contention state."

At time T5, the A/D conversion trigger input 120 is input, but since the state is the "PWM contention state," the AD/PWM contention state signal 60 changes to the AD/PWM contention state, and the output of the A/D conversion trigger output 140 itself is canceled.

At time T6, the measurement of the arbitrary time is completed, and the PWM contention state signal 40 changes to the "PWM non-contention state."

Figure 7:
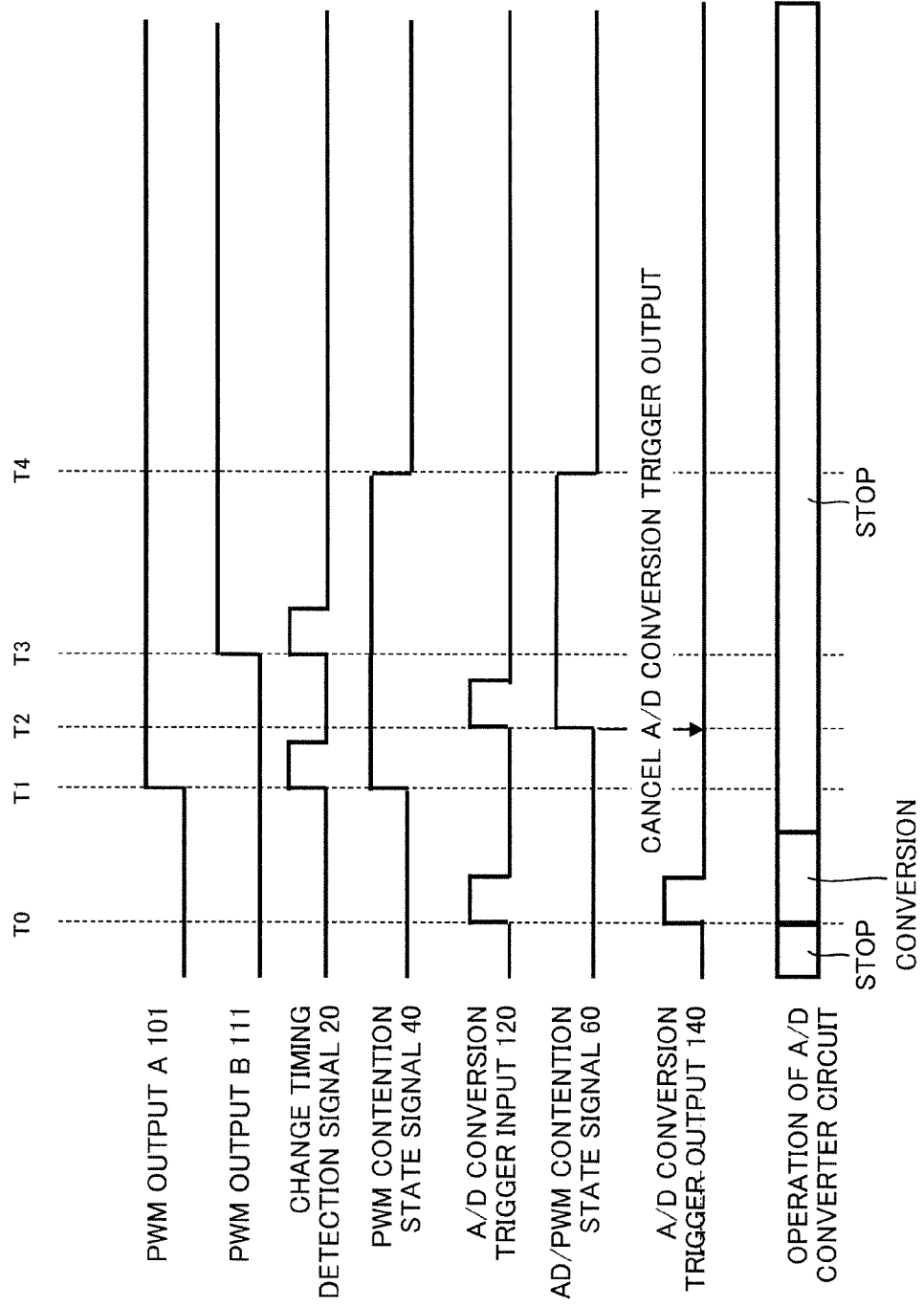
FIG. 7 is a timing chart showing yet another example of operation of the contention avoidance control device of the first embodiment.

FIG. 7 is a timing chart showing yet another example of operation of the contention avoidance control device illustrated in FIG. 1.

At time T0, the A/D conversion trigger input 120 is input, but since each of the PWM output A 101 and the PWM output B 111 does not change (i.e., is in the PWM non-contention state), the A/D conversion trigger input 120 is output as the A/D conversion trigger output 140 without change, and the A/D converter circuit 130 performs A/D conversion.

At time T1, the PWM output A 101 changes so that the PWM change detector 2 generates the change timing detection signal 20, and measurement of an arbitrary time starts. During the measurement, the PWM contention state signal 40 is output as the "PWM contention state."

At time T2, the A/D conversion trigger input 120 is input, but since the state is the "PWM contention state," the AD/PWM contention state signal 60 changes to the AD/PWM contention state, and the output of the A/D conversion trigger output 140 itself is canceled.

At time T3, the PWM output B 111 changes before the measurement of the arbitrary time that has started at time T1 is completed. The PWM change detector 2 generates the change timing detection signal 20, and measurement of another arbitrary time starts at time T3. During the measurement, the PWM contention state signal 40 is output as the "PWM contention state." Thus, the "PWM contention state" that has started at time T1 continues without change.

At time T4, the measurement of the arbitrary time that has started at time T3 is completed, and the PWM contention state signal 40 changes to the "PWM non-contention state."

In the first embodiment, the contention avoidance control device 1 has been described. The functions shown in the flow charts of FIGS. 2 and 3 may be implemented by software.

Second Embodiment

Figure 8:
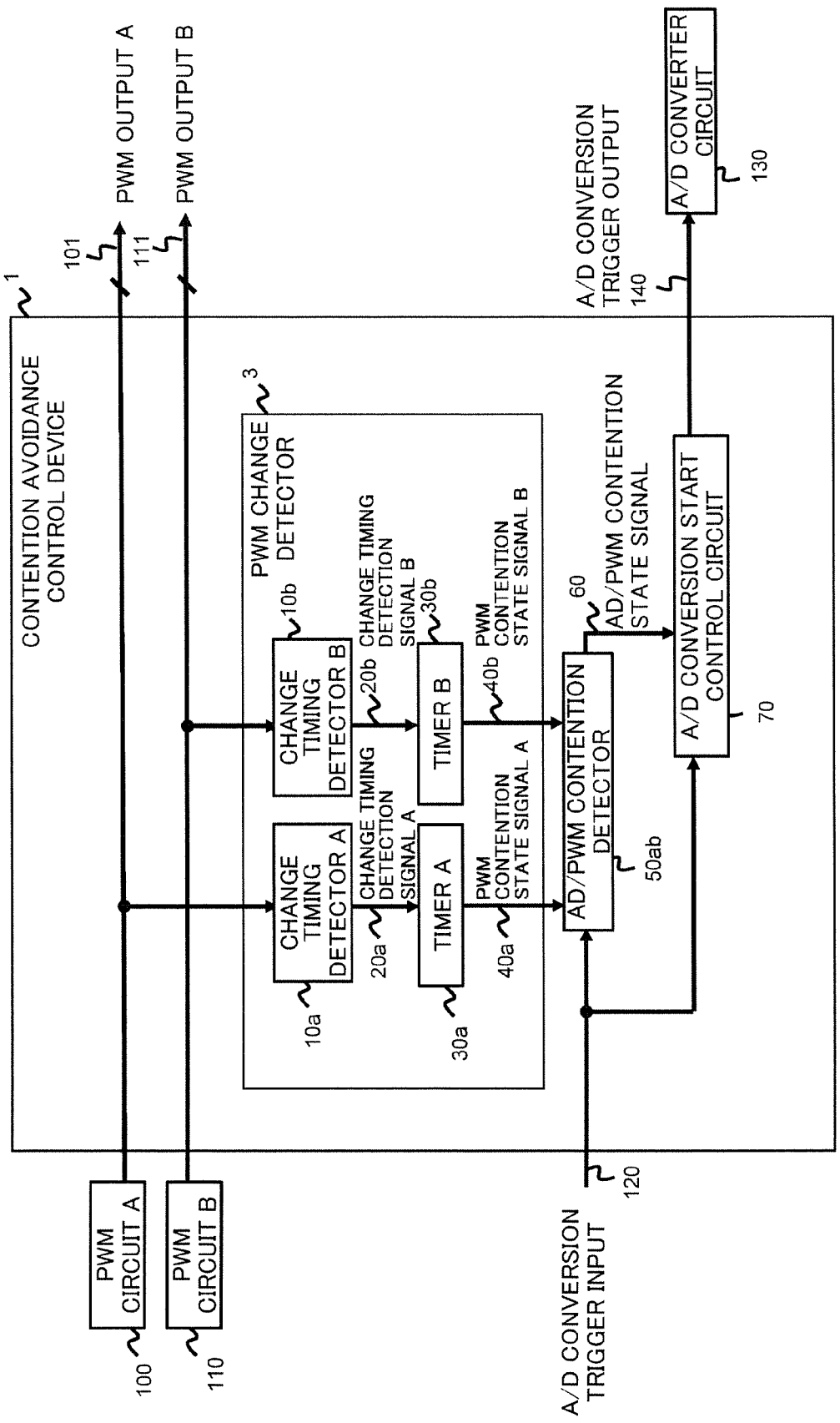
FIG. 8 illustrates a contention avoidance control device according to a second embodiment.

FIG. 8 illustrates an example configuration of a contention avoidance control device according to a second embodiment of the present disclosure. The second embodiment is different from the first embodiment in that a PWM output A 101 and a PWM output B 111 individually include change timing detectors and timers. Only different aspects from the first embodiment will be described.

The contention avoidance control device 1 includes a PWM change detector 3 and an AD/PWM contention detector 50ab. The PWM change detector 3 receives the change timings of a PWM output A 101 and a PWM output B 111 and outputs a PWM contention state signal A 40a and a PWM contention state signal B 40b indicating states (hereinafter referred to as a PWM contention state A and a PWM contention state B) in predetermined times based on the change timings of the PWM output A 101 and the PWM output B 111, respectively. The AD/PWM contention detector 50ab outputs an AD/PWM contention state signal 60 indicating a contention state (AD/PWM contention state) between A/D conversion and PWM when receiving an A/D conversion trigger input 120 while the PWM contention state signal A 40a shows the PWM contention state A or the PWM contention state signal B 40b shows the PWM contention state B. Other circuit components are not different from those of the first embodiment.

The PWM change detector 3 includes a change timing detector 10a that detects the change timing of the PWM output A 101 and a change timing detector 10b that detects the change timing of the PWM output B 111. The change timing detector 10a outputs a change timing detection signal 20a when detecting a change of the PWM output A 101. The change timing detector 10b outputs a change timing detection signal 20b when detecting a change of the PWM output B 111. The PWM change detector 3 also includes a timer 30a that measures an arbitrary time that starts when the change timing detection signal 20a changes, and a timer 30b that measures an arbitrary time that starts when the change timing detection signal 20b changes.

The difference between the arbitrary time measured by the timer 30a and the arbitrary time measured by the timer 30b occurs because the times in which noise can be reduced are individually determined for cases with different noise influences on the A/D converter circuit 130 due to difference in device characteristics among motor-driving transistor circuits controlled by the PWM output A 101 or the PWM output B 111.

Figure 9:
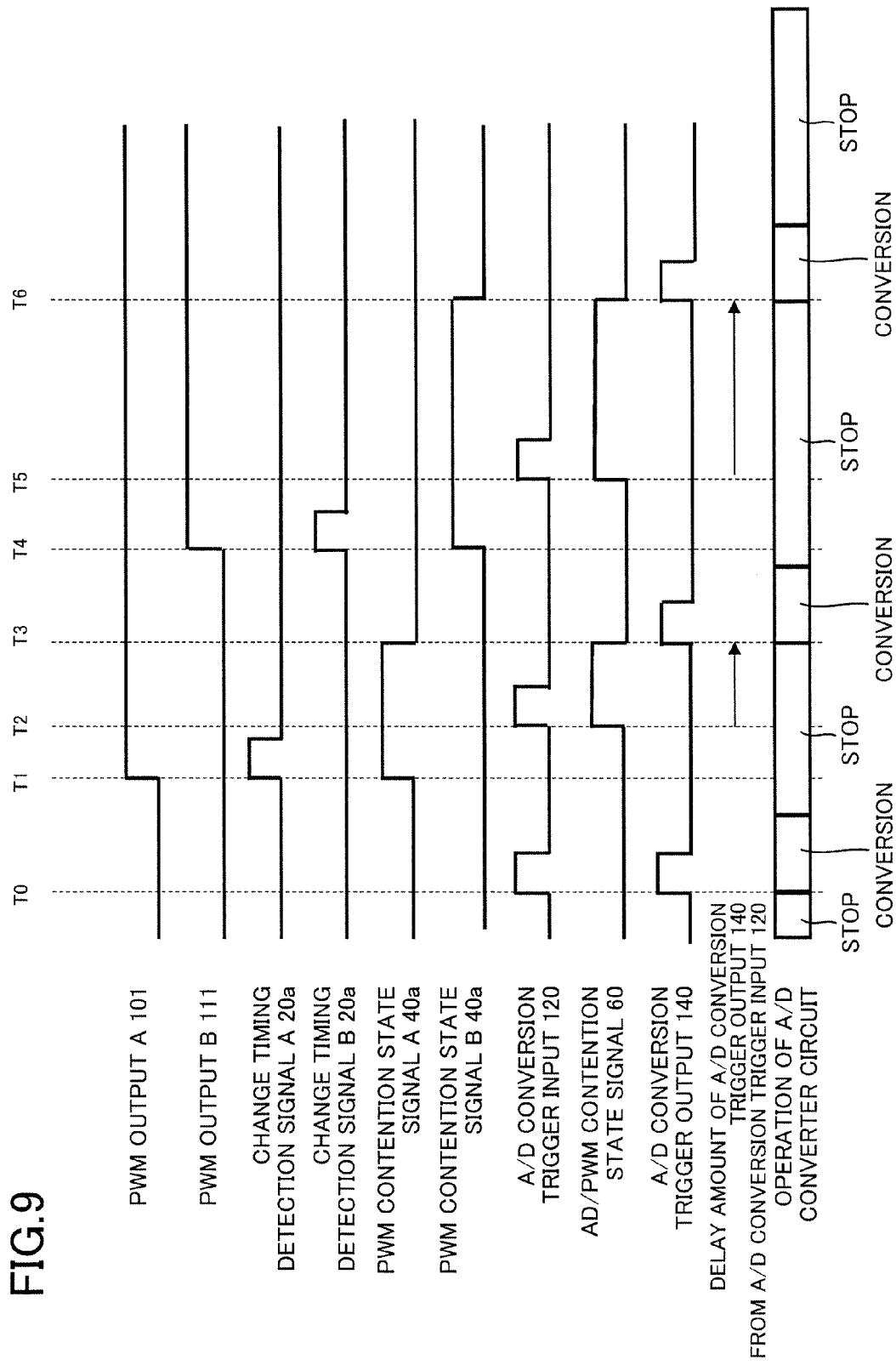
FIG. 9 is a timing chart showing an example of operation of the contention avoidance control device of the second embodiment.

FIG. 9 is a timing chart showing an example of operation of the contention avoidance control device illustrated in FIG. 8.

The example of FIG. 9 is different from the example of FIG. 4 of the first embodiment in that the PWM contention state includes two types of the states: a PWM contention state A and a PWM contention state B, and the time of the PWM contention state B is longer than that of the PWM contention state A in the example of FIG. 9.

In this case, the time from when the A/D conversion trigger input 120 is input to when the A/D conversion trigger output 140 changes is delayed for a longer time in a case where the A/D conversion trigger input 120 is input in the PWM contention state A than in a case where the A/D conversion trigger input 120 is input in the PWM contention state B.

In the second embodiment, the time of the PWM contention state B is longer than the time of the PWM contention state A. Alternatively, the time of the PWM contention state B may be shorter than the time of the PWM contention state A.

Figure 10:
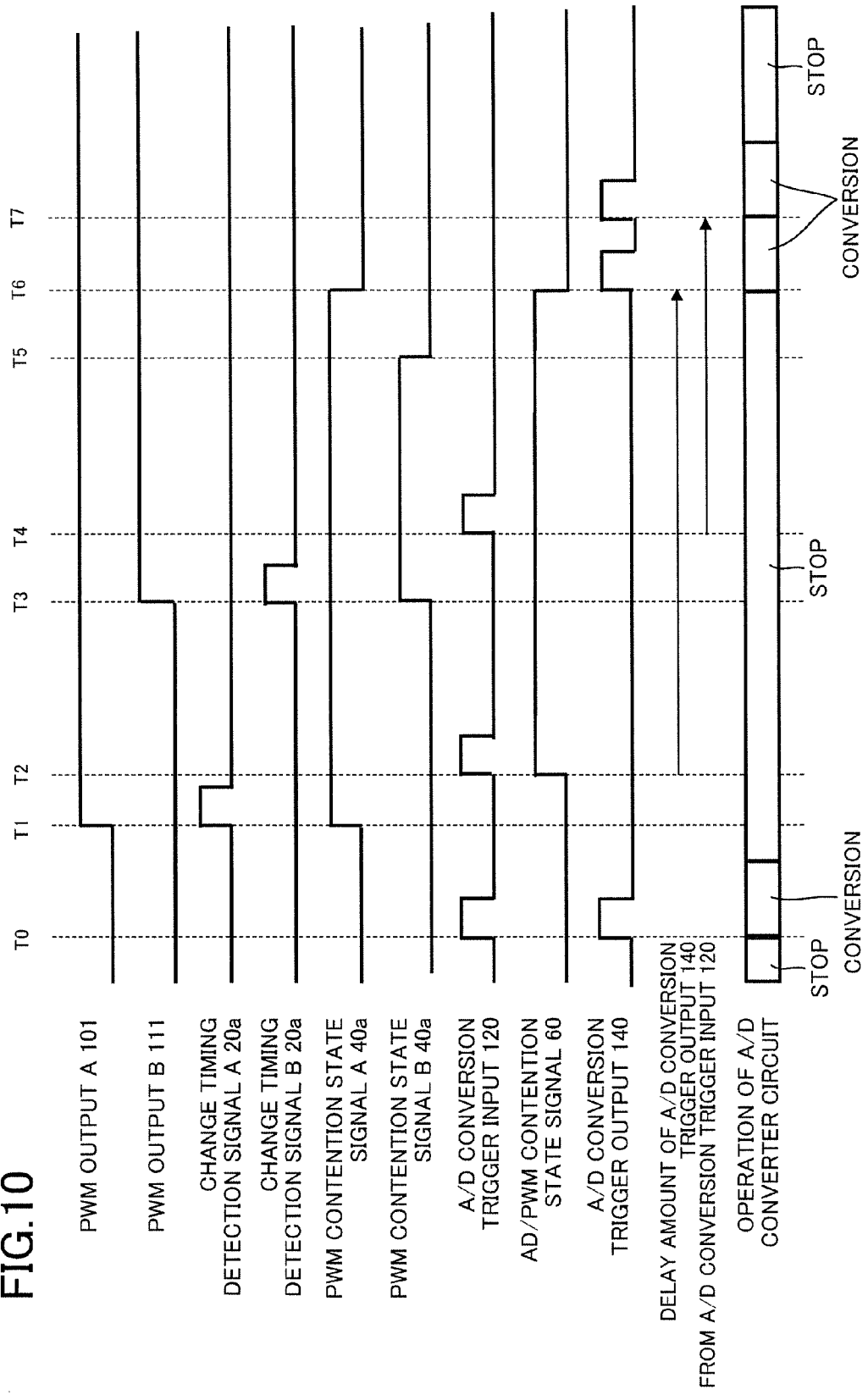
FIG. 10 is a timing chart showing another example of operation of the contention avoidance control device of the second embodiment.

FIG. 10 is a timing chart showing another example of operation of the contention avoidance control device illustrated in FIG. 8. This example is different from the example of FIG. 9 in that the end time of the PWM contention state A that shows the "PWM contention state" first is posterior to the end time of the PWM contention state B that shows the "PWM contention state" later.

At time T0, the A/D conversion trigger input 120 is input, but each of the PWM output A 101 and the PWM output B 111 does not change (i.e., is in the PWM non-contention state), the A/D conversion trigger input 120 is output as the A/D conversion trigger output 140 without change, and the A/D converter circuit 130 performs A/D conversion.

At time T1, the PWM output A 101 changes so that the PWM change detector 3 generates the change timing detection signal 20a, and measurement of an arbitrary time starts. During the measurement, the PWM contention state signal A 40a is output as the "PWM contention state."

At time T2, the A/D conversion trigger input 120 is input, but since the state is the "PWM contention state," the AD/PWM contention state signal 60 changes to the AD/PWM contention state, and the output of the A/D conversion trigger output 140 itself is canceled.

At time T3, the PWM output B 111 changes before the measurement of the arbitrary time that has started at time T1 is completed. The PWM change detector 3 generates the change timing detection signal 20b, and measurement of another arbitrary time starts at time T3. During the measurement, the PWM contention state signal B 40b is output as the "PWM contention state."

At time T4, the A/D conversion trigger input 120 is input, but since the state is the "PWM contention state," the AD/PWM contention state signal 60 remains in the "AD/PWM contention state" from time T2, and the output of the A/D conversion trigger output 140 itself is canceled.

At time T5, the measurement of the arbitrary time that has started at time T3 is completed, and the PWM contention state signal B 40b changes to the "PWM non-contention state." However, since the measurement of the arbitrary time that has started at the time T1 is not completed, the PWM contention state signal A 40a remains in the "PWM contention state."

At time T6, the measurement of the arbitrary time that has started at time T1 is completed, and the PWM contention state signal A 40a changes to the "PWM non-contention state" and the AD/PWM contention state signal 60 changes to the "AD/PWM non-contention state." At this time, the A/D conversion trigger output 140 corresponding to the A/D conversion trigger input 120 received at time T2 is output, and the A/D converter circuit 130 performs A/D conversion.

At time T7, the A/D conversion trigger output 140 corresponding to the A/D conversion trigger input 120 received at time T4 is output, and the A/D converter circuit 130 performs A/D conversion.

That is, in a case where the "PWM contention states" of the multiple PWM outputs overlap in terms of time, the "PWM contention state" that changes to the "PWM non-contention state" at the latest is used for generating the "AD/PWM contention state signal 60."

In the second embodiment, A/D conversion starts at time T6 and time T7 with respect to the A/D conversion trigger inputs 120 received at the time T2 and time T4, respectively. Alternatively, A/D conversion with respect to the A/D conversion trigger input 120 received at one of time T2 or time T4 may be canceled. That is, A/D conversion operation may be performed once after the transition from the AD/PWM contention state to the AD/PWM non-contention state.

Third Embodiment

Figure 11:
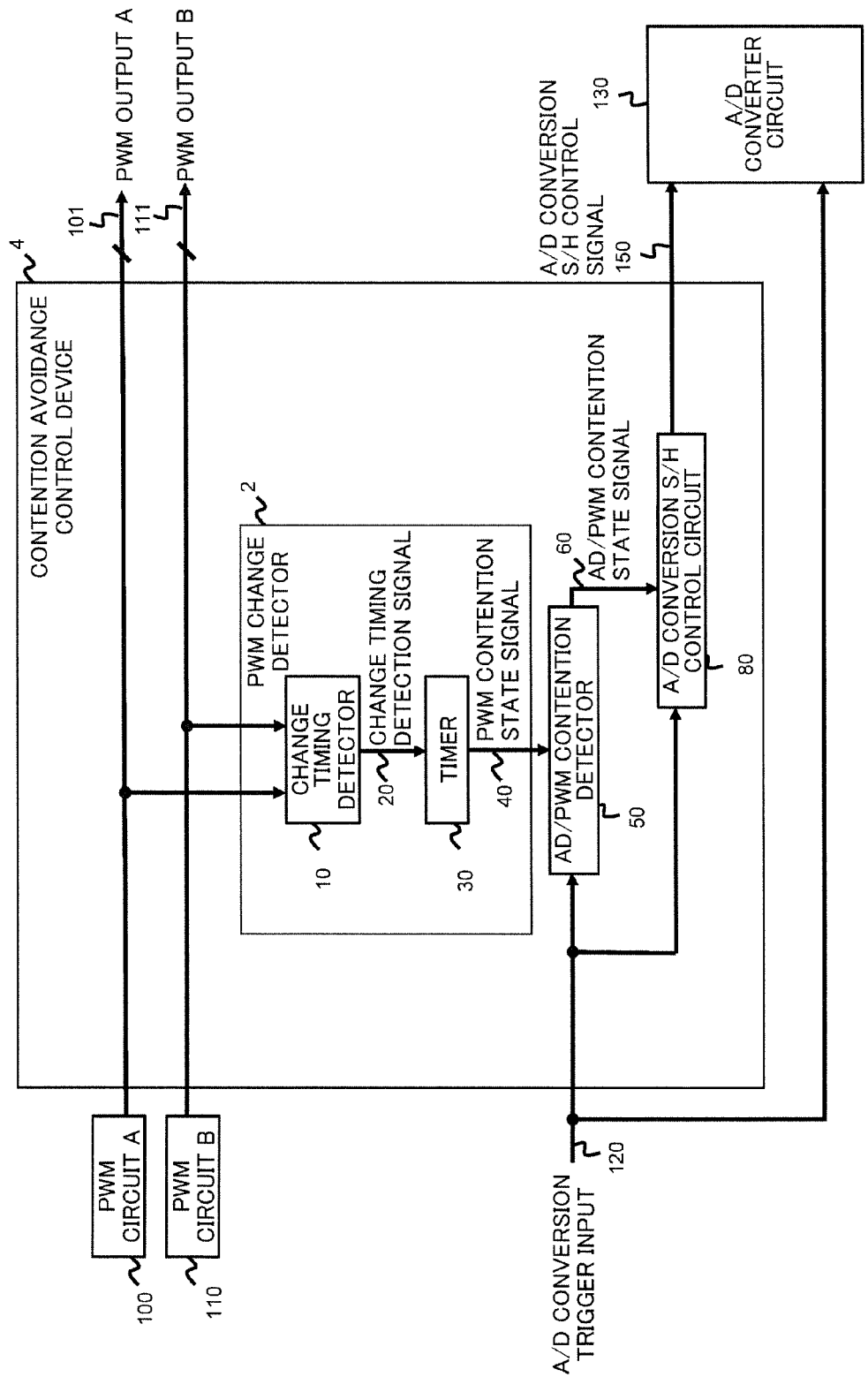
FIG. 11 illustrates a contention avoidance control device according to a third embodiment.

FIG. 11 illustrates an example configuration of a contention avoidance control device according to a third embodiment of the present disclosure. The third embodiment is different from the first embodiment in that the A/D conversion trigger output 140 of the first embodiment is output as an A/D conversion sample-and-hold control signal 150 (hereinafter referred to as an A/D conversion S/H control signal 150). Only aspects different from those of the first embodiment will be described.

An output of an A/D conversion S/H control circuit 80 having the same function as the A/D conversion start control circuit 70 of the first embodiment illustrated in FIG. 1 is output to an A/D converter circuit 130 as the A/D conversion S/H control signal 150.

An A/D conversion trigger input 120 itself is input to the A/D converter circuit 130 without any processing such as delaying or cancelling by a contention avoidance control circuit 4.

In this configuration, although A/D conversion of the A/D converter circuit 130 itself starts because of the input of the A/D conversion trigger input 120, a sample-and-hold time of an AD input of the A/D converter circuit 130 can be extended based on the A/D conversion S/H control signal 150 delayed for an arbitrary time. Thus, an object of the present disclosure, i.e., reduction of the noise influence on the A/D converter circuit 130 can be reduced.

Fourth Embodiment

Figure 12:
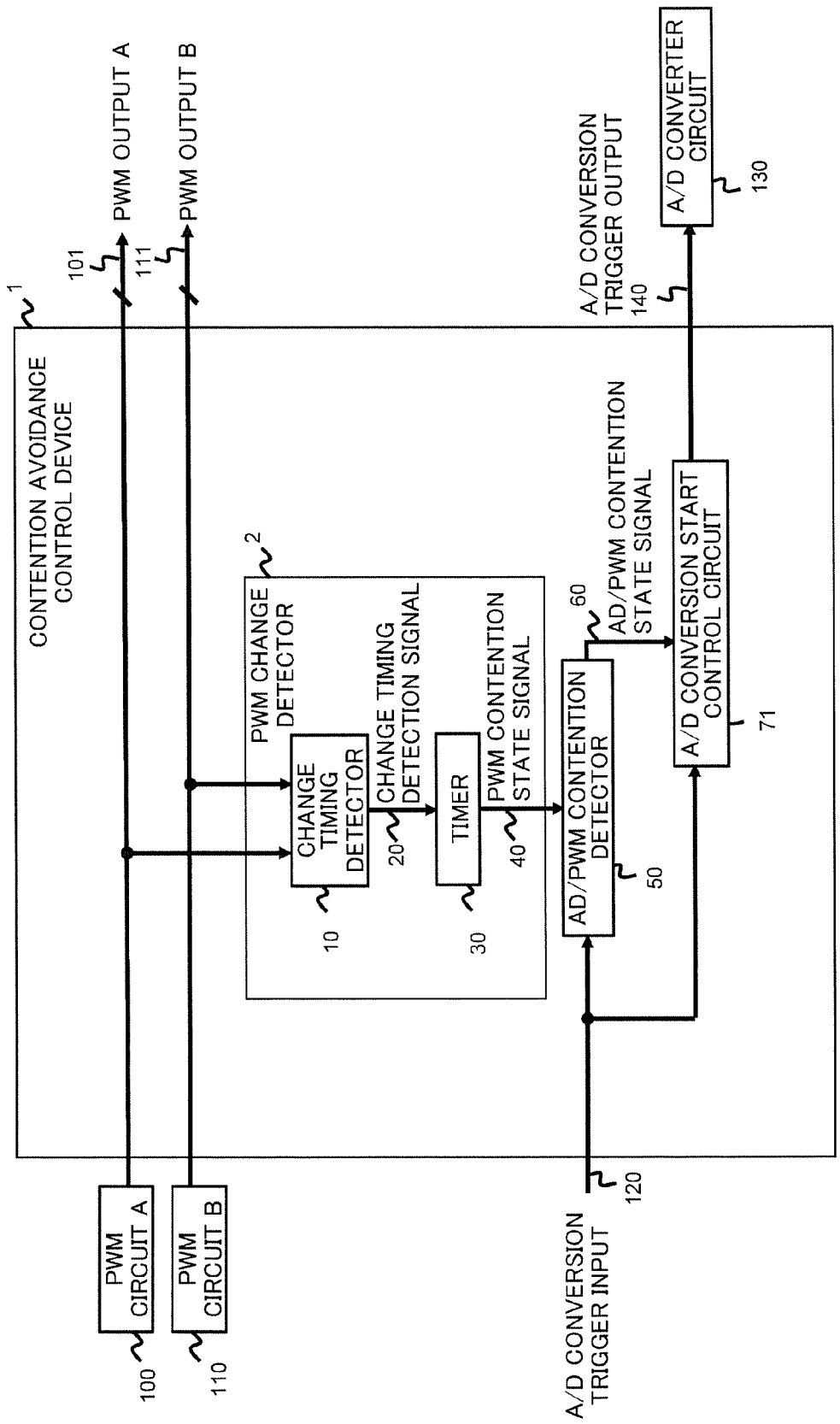
FIG. 12 illustrates a contention avoidance control device according to a fourth embodiment.

FIG. 12 illustrates an example configuration of a contention avoidance control device according to a fourth embodiment of the present disclosure. The fourth embodiment is different from the first embodiment in that the A/D conversion start control circuit 70 of the first embodiment is replaced by an A/D conversion start control circuit 71. Only aspects different from those of the first embodiment will be described.

The A/D conversion start control circuit 71 includes a counter (not shown) using a change of input of an A/D conversion trigger input 120 as a start timing, and measures a second arbitrary time different from an arbitrary time measured by a timer 30.

The second arbitrary time is less than or equal to a specified time from when the A/D conversion trigger input 120 is input to when A/D conversion of an A/D converter circuit 130 should be started.

After a lapse of the second arbitrary time from the input of the A/D conversion trigger input 120, the A/D conversion trigger input 120 is output as an A/D conversion trigger output 140, irrespective of the state of an AD/PWM contention state signal 60.

In this manner, as described with reference to FIG. 5, A/D conversion of the A/D converter circuit 130 can be forcedly started even when the "AD/PWM contention state" continues because of consecutive changes of a plurality of PWM outputs. Thus, it is possible to prevent a failure of the A/D conversion.

First Variation of Fourth Embodiment

A contention avoidance control device according to a first variation of the fourth embodiment will be described. The first variation is different from the fourth embodiment in that the A/D conversion start control circuit 71 includes the counter (not shown) using a change of input of the A/D conversion trigger input 120 as a start timing, and measures a third arbitrary time different from an arbitrary time measured by the timer 30.

The third arbitrary time is set as a specified time in which after a lapse of the third arbitrary time from when the A/D conversion trigger input 120 is input and changed to an AD/PWM contention state to when the A/D conversion trigger input 120 changes to an AD/PWM non-contention state, an output of the A/D conversion trigger output 140 itself is canceled such that A/D conversion of the A/D converter circuit 130 does not start.

In this manner, in a case where the AD/PWM contention state continues for a long time after the input of the A/D conversion trigger input 120, and then after a lapse of the third arbitrary time until the A/D conversion trigger input 120 changes to the AD/PWM non-contention state, an A/D conversion result of the A/D converter circuit 130 at this time is determined to be unnecessary for the system because of an excessive lapse of time, unnecessary A/D conversion can be canceled.

Second Variation of Fourth Embodiment

A contention avoidance control device according to a second variation of the fourth embodiment will be described. The second variation is different from the fourth embodiment in that the A/D conversion start control circuit 71 includes a counter (not shown) that counts changes of the A/D conversion trigger input 120 up to a predetermined number of times.

When the A/D conversion trigger input 120 is input the predetermined number of times in the "AD/PWM contention state," the A/D conversion trigger input 120 is output as the A/D conversion trigger output 140, irrespective of the state of the AD/PWM contention state signal 60.

In this manner, as described with reference to FIG. 5, A/D conversion of the A/D converter circuit 130 can be forcedly started even when the "AD/PWM contention state" continues because of consecutive changes of a plurality of PWM outputs. Thus, it is possible to prevent a failure of the A/D conversion.

Third Variation of Fourth Embodiment

A contention avoidance control device according to a third variation of the fourth embodiment will be described. The third variation is different from the fourth embodiment in that the A/D conversion start control circuit 71 includes a counter (not shown) that counts changes of the A/D conversion trigger input 120 up to a predetermined number of times.

When the A/D conversion trigger input 120 is input the predetermined number of times in the "AD/PWM contention state," the output of the A/D conversion trigger output 140 itself is canceled such that A/D conversion of the A/D converter circuit 130 does not start, irrespective of the state of the AD/PWM contention state signal 60.

In this manner, in a case where the AD/PWM contention state continues for a long time after the input of the A/D conversion trigger input 120, and then when the A/D conversion trigger input 120 is input the predetermined number of times before changing to the AD/PWM non-contention state, A/D conversion of the A/D converter circuit 130 that should be performed using the A/D conversion trigger input 120 as a trigger is not performed a plurality of times and, therefore, a subsequent A/D conversion result of the A/D converter circuit 130 is determined to be unnecessary for the system, unnecessary A/D conversion can be canceled.

Fifth Embodiment

Figure 13:
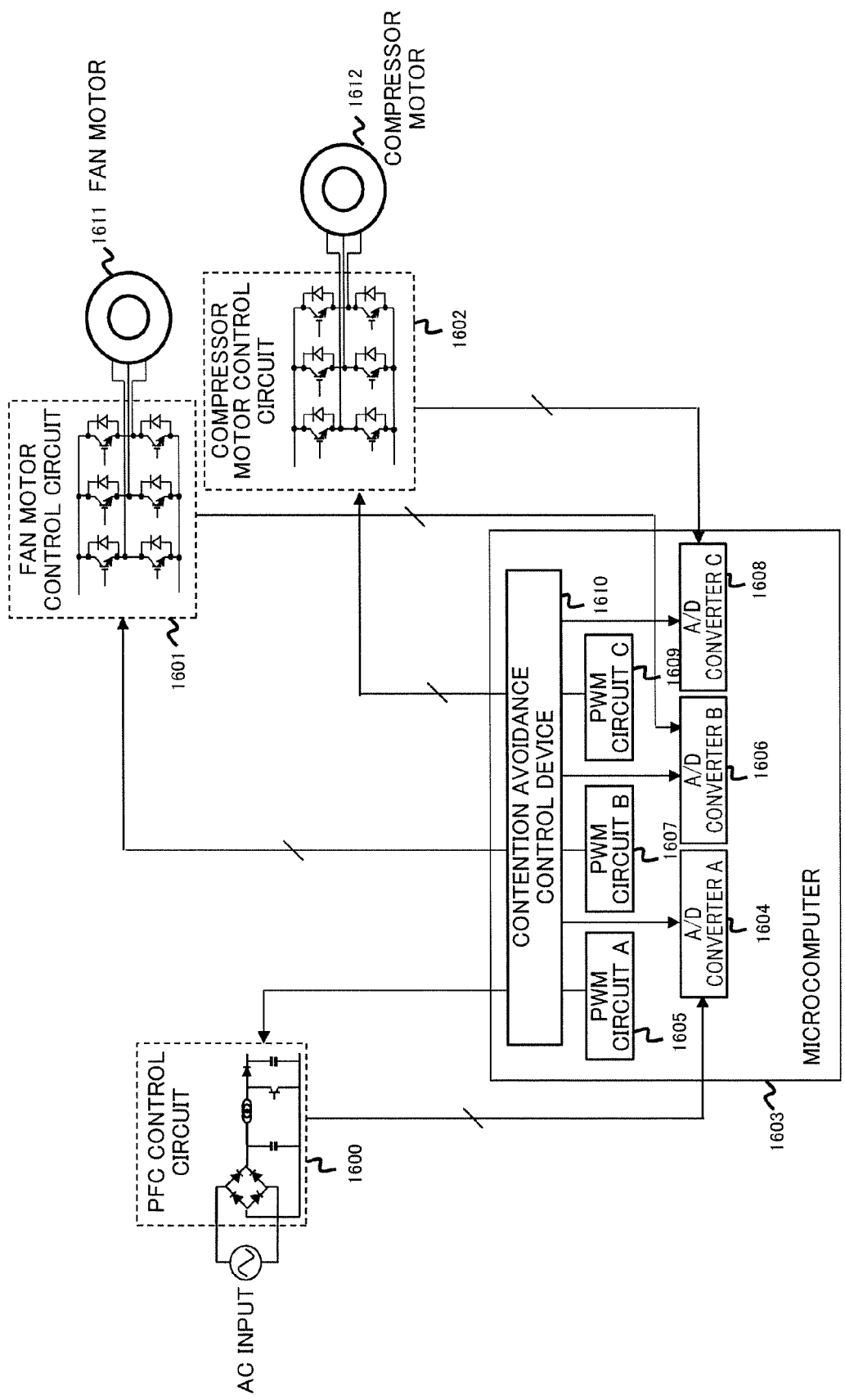
FIG. 13 illustrates an air conditioner outdoor unit system according to a fifth embodiment.

FIG. 13 illustrates an example system configuration used for an air conditioner outdoor unit according to a fifth embodiment of the present disclosure.

In the air conditioner outdoor unit system of this embodiment, a microcomputer 1603 controls a PFC control circuit 1600 that increases a power factor in converting an AC power supply to a DC voltage, a fan motor control circuit 1601 that controls a fan motor 1611 of the outdoor unit, and a compressor motor control circuit 1602 that controls a compressor motor 1612 of the outdoor unit.

The PFC control circuit 1600 inputs analog values of an input voltage, an input current, and an output voltage to an A/D converter A 1604, determines an output waveform of a PWM circuit A 1605 based on a conversion result of the A/D converter A 1604, and controls am output current and an output voltage based on a PWM output of the PWM circuit A 1605.

The fan motor control circuit 1601 inputs an analog value of a current flowing in the fan motor 1611 to an A/D converter B 1606 of the microcomputer, determines an output waveform of a PWM circuit B 1607 based on a conversion result of the A/D converter B 1606, and controls rotation of the fan motor 1611 based on a PWM output of the PWM circuit B 1607.

The compressor motor control circuit 1602 inputs an analog value of a compressor motor current to an A/D converter C 1608 of the microcomputer, determines an output waveform of a PWM circuit C 1609 based on a conversion result of the A/D converter C 1608, and controls rotation of the compressor motor 1612 based on a PWM output of the PWM circuit C 1609.

The PFC control circuit 1600, the fan motor control circuit 1601, and the compressor motor control circuit 1602 are individually controlled in different periods. The microcomputer 1603 includes the contention avoidance control device 1610 of the first through fourth embodiments. The contention avoidance control device 1610 detects change timings of the PWM outputs of the PWM circuit A 1605, the PWM circuit B 1607, and the PWM circuit C 1609 used for the PFC control circuit 1600, the fan motor control circuit 1601, and the compressor motor control circuit 1602, respectively, and delays A/D conversion trigger inputs of the A/D converter A 1604, the A/D converter B 1606, and the A/D converter C 1608 that are input within an arbitrary time measured by the change timings, thereby changing A/D conversion timings of the A/D converter A 1604, the A/D converter B 1606, and the A/D converter C 1608.

In this manner, it is possible to avoid contention between the PWM outputs for controlling the PFC control circuit 1600, the fan motor control circuit 1601, and the compressor motor control circuit 1602 and A/D conversion. Thus, stable operation can be achieved without the influence of switching noise of the power devices during the A/D conversion.

This embodiment is not limited to the air conditioner outdoor unit system and is also applicable to motor control systems widely employed for household electric appliances such as washing machines and refrigerators, industrial use such as AC servos and general-purpose inverters, and in-vehicle use such as drive motors and electric compressors.

Sixth Embodiment

Figure 14:
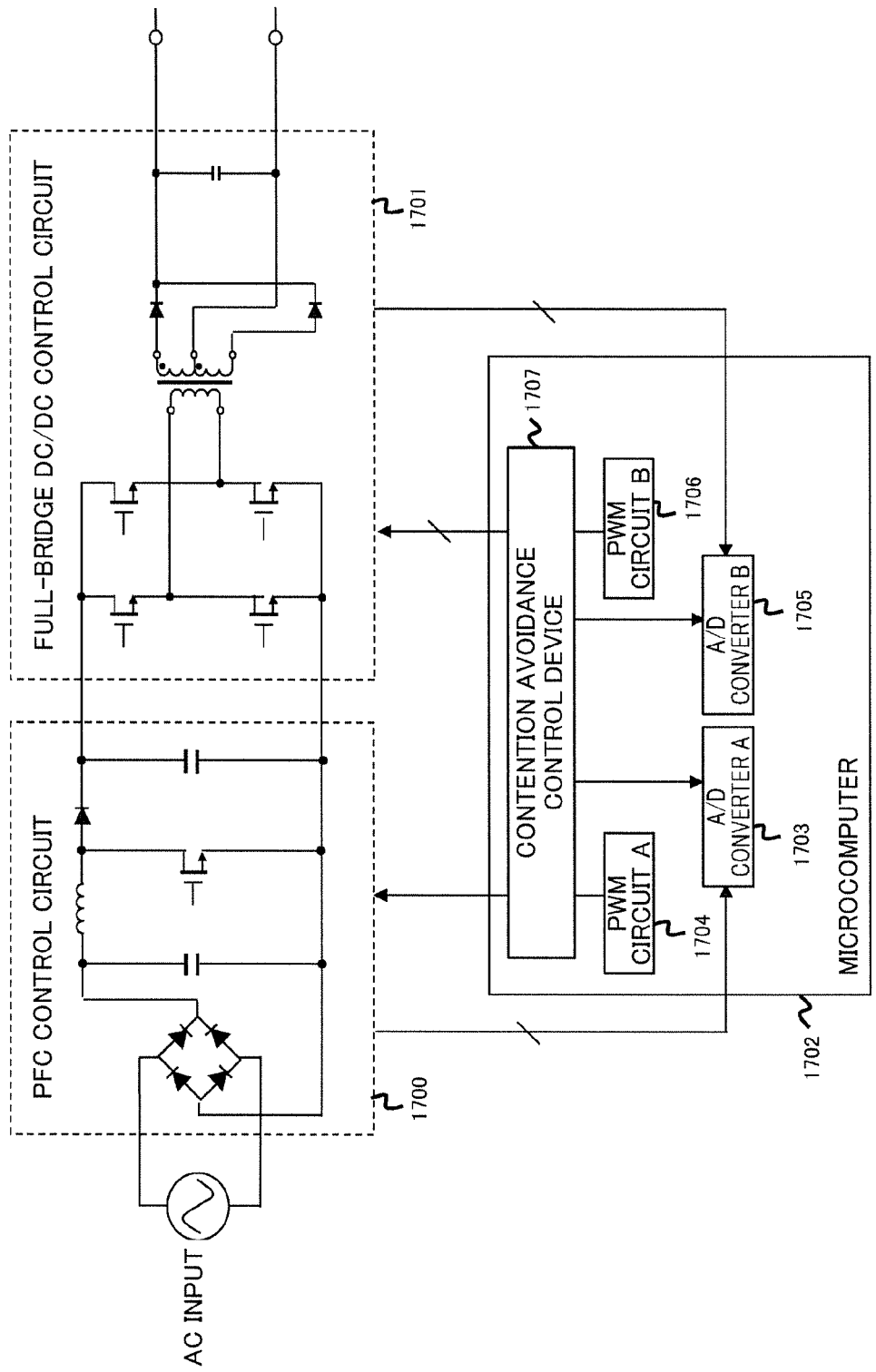
FIG. 14 illustrates a server power supply system according to a sixth embodiment.

FIG. 14 illustrates an example system configuration for use in a server power supply according to a sixth embodiment of the present disclosure.

The server power supply system of this embodiment includes a PFC control circuit 1700 that increases a power factor in converting an AC power supply to a DC voltage and a full-bridge DC/DC control circuit 1701 that converts the DC voltage to a DC voltage for an internal supply. The PFC control circuit 1700 and the full-bridge DC/DC control circuit 1701 are controlled by a microcomputer 1702.

The PFC control circuit 1700 inputs analog values of an input voltage, an input current, and an output voltage to an A/D converter A 1703, determines an output waveform of a PWM circuit A 1704 based on a conversion result of the A/D converter A 1703, and controls an output current and an output voltage based on a PWM output of the PWM circuit A 1704.

The full-bridge DC/DC control circuit 1701 inputs analog values of an output current and an output voltage to an A/D converter B 1705, determines an output waveform of a PWM circuit B 1706 based on a conversion result of the A/D converter B 1705, and controls an output voltage based on a PWM output of the PWM circuit B 1706.

The PFC control circuit 1700 and the full-bridge DC/DC control circuit 1701 are individually controlled in different periods.

The microcomputer 1702 includes the contention avoidance control device 1707 of the first through fourth embodiments. The contention avoidance control device 1707 detects change timings of the PWM outputs of the PWM circuit A 1704 and the PWM circuit B 1607 used for the PFC control circuit 1700 and the full-bridge DC/DC control circuit 1701, respectively, and delays A/D conversion trigger inputs of the A/D converter A 1703 and the A/D converter B 1705 that are input within an arbitrary time measured based on the change timings, thereby detecting A/D conversion timings of the A/D converter A 1703 and the A/D converter B 1705.

In this manner, it is possible to avoid contention between the PWM outputs for controlling the PFC control circuit 1700 and the full-bridge DC/DC control circuit 1701 and A/D conversion. Thus, stable operation can be achieved without the influence of switching noise of the power devices during the A/D conversion.

This embodiment is useful for not only the server power supply system but also power supply systems such as photovoltaic power generation, LED control, and chargers.

A contention avoidance control device and a contention avoidance control method for PWM output and A/D conversion according to the present disclosure are useful for reducing the influence of noise caused by changes of a plurality of PWM outputs, and furthermore, transmission of switching noise of power devices for a plurality of motors, which might reduce conversion accuracy of an A/D converter circuit, while controlling the motors with different frequencies.

What is claimed is:

1. A contention avoidance control device for pulse width modulation (PWM) output and analog-to-digital (A/D) conversion, wherein
   the contention avoidance control device detects a change timing of each of a plurality of PWM outputs and inhibits an output of a received AD conversion trigger to an A/D converter at least during a predetermined time measured based on each of the change timings.

2. The contention avoidance control device of claim 1, wherein after a lapse of the predetermined time, an A/D conversion trigger input received in the predetermined time is output as an A/D conversion trigger output to the A/D converter.

3. The contention avoidance control device of claim 1, wherein
the predetermined time is arbitrarily set.

4. The contention avoidance control device of claim 1, wherein
the contention avoidance control device detects the change timing by detecting at least one of a rising edge or a falling edge of the PWM output.

5. The contention avoidance control device of claim 2, wherein
the A/D conversion trigger input is output as the A/D conversion trigger output in a case where the A/D conversion trigger input is not output after a lapse of an arbitrary time from reception of the A/D conversion trigger input.

6. The contention avoidance control device of claim 2, wherein
the A/D conversion trigger input is not output when an arbitrary time has elapsed from reception of the A/D conversion trigger input.

7. The contention avoidance control device of claim 2, wherein
the A/D conversion trigger input is output as the A/D conversion trigger output in a case where the A/D conversion trigger input is not output when the A/D conversion trigger input is counted up to a predetermined number of times within the predetermined time.

8. The contention avoidance control device of claim 2, wherein
the A/D conversion trigger input is not output in a case where the A/D conversion trigger input is counted up to a predetermined number of times within the predetermined time.

9. The contention avoidance control device of claim 2, wherein
the A/D conversion trigger input is output as an A/D conversion sample-and-hold control signal to the A/D converter circuit, and
the A/D conversion sample-and-hold control signal is used to extend a sample-and-hold time of the A/D converter circuit for the predetermined time.

10. The contention avoidance control device of claim 1, wherein
an A/D conversion trigger input received in a predetermined time measured based on each of the change timings is not output.

11. A power control system comprising:
a plurality of converter devices; and
a microcomputer that includes the contention avoidance control device of claim 1 and controls the plurality of converter devices, wherein
the microcomputer controls the plurality of converter devices so as to avoid contention between PWM outputs for controlling the plurality of converter devices and A/D conversion.

12. The power control system of claim 11, wherein
each of the plurality of converter devices is an inverter or a converter.

13. The power control system of claim 12, wherein
each of the plurality of converter devices is either the inverter that controls a motor or the converter that controls one of AC to DC conversion, DC to DC conversion, DC to AC conversion, or AC to AC conversion.

14. A contention avoidance control method for avoiding contention between PWM output and A/D conversion, the method comprising:
detecting a change timing of each of a plurality of PWM outputs; and
inhibiting an output of a received A/D conversion trigger to an A/D converter circuit at least during a predetermined time measured based on each of the change timings.

15. The method of claim 14, further comprising:
outputting an A/D conversion trigger input received in the predetermined time as an A/D conversion trigger output to the A/D converter circuit after a lapse of the predetermined time.

16. The method of claim 14, wherein
the predetermined time is arbitrarily set.

17. The method of claim 14, wherein
the change timing is detected by detecting at least one of a rising edge or a falling edge of the PWM output.

18. The method of claim 15, wherein
the A/D conversion trigger input is output as the A/D conversion trigger output in a case where the A/D conversion trigger input is not output after a lapse of an arbitrary time from reception of the A/D conversion trigger input.

19. The method of claim 15, wherein
the A/D conversion trigger input is not output when an arbitrary time has elapsed from reception of the A/D conversion trigger input.

20. The method of claim 18, wherein
the A/D conversion trigger input is not output in a case where a change of the A/D conversion trigger input is counted up to a predetermined number of times within the predetermined time.

21. The method of claim 15, wherein
the A/D conversion trigger input is output as the A/D conversion trigger output in a case where the A/D conversion trigger input is not output when the A/D conversion trigger input is counted to a predetermined number of times within the predetermined time.

22. The method of claim 19, wherein
an A/D conversion trigger input received in a predetermined time measured based on each of the change timings is not output.

23. The method of claim 15, further comprising:
outputting the A/D conversion trigger input as an A/D conversion sample-and-hold control signal to an A/D converter circuit, wherein
the A/D conversion sample-and-hold control signal is used to extend a sample-and-hold time of the A/D converter circuit for the predetermined time.

* * * * *